United States Patent
Conway et al.

(10) Patent No.: US 7,478,256 B2
(45) Date of Patent: Jan. 13, 2009

(54) COORDINATING DATA SYNCHRONOUS TRIGGERS ON MULTIPLE DEVICES

(75) Inventors: Craig M. Conway, Austin, TX (US); Jeff A. Bergeron, Austin, TX (US); Daniel J. Baker, Austin, TX (US)

(73) Assignee: National Instruments Corporation, Austin, TX (US)

(*) Notice: Subject to any disclaimer, the term of this patent is extended or adjusted under 35 U.S.C. 154(b) by 534 days.

(21) Appl. No.: 11/338,923

(22) Filed: Jan. 24, 2006

(65) Prior Publication Data
US 2007/0174647 A1 Jul. 26, 2007

(51) Int. Cl.
*G06F 1/12* (2006.01)
(52) U.S. Cl. .................. 713/401; 713/501; 326/93; 327/141; 327/162
(58) Field of Classification Search ................. 713/401, 713/501, 600; 326/93; 327/141, 162
See application file for complete search history.

(56) References Cited

U.S. PATENT DOCUMENTS

| | | | |
|---|---|---|---|
| 4,980,577 A | 12/1990 | Baxter | |
| 5,442,776 A * | 8/1995 | Masleid et al. | 713/503 |
| 5,450,458 A | 9/1995 | Price et al. | |
| 5,717,704 A | 2/1998 | Rosenfeld | |
| 5,748,916 A | 5/1998 | Conway et al. | |
| 5,822,554 A | 10/1998 | Conway | |
| 5,969,631 A | 10/1999 | Ammler et al. | |
| 6,127,976 A | 10/2000 | Boyd et al. | |
| 6,163,583 A | 12/2000 | Lin et al. | |
| 6,297,760 B1 | 10/2001 | Hungerbuehler et al. | |
| 6,393,577 B1 * | 5/2002 | Akamatsu et al. | 713/600 |
| 6,836,851 B2 * | 12/2004 | Dive | 713/400 |
| 6,950,440 B1 | 9/2005 | Conway | |
| 7,380,152 B2 * | 5/2008 | Chung | 713/500 |
| 2001/0011313 A1 | 8/2001 | Hungerbuehler et al. | |
| 2004/0064750 A1 | 4/2004 | Conway | |
| 2005/0190875 A1 | 9/2005 | Feiereisel et al. | |
| 2006/0037008 A1 | 2/2006 | Stelzer et al. | |
| 2006/0059400 A1 | 3/2006 | Clark et al. | |

OTHER PUBLICATIONS

"PXI"; Measurement and Automation Catalog; 2003; pp. 148-179; National Instruments Corporation.
"Bus Synchronizes Clock and Triggers in Modules to 100 ps!"; retrieved from the Internet: http://www.acqiris.com/home/EntreProduct12.html; Jun. 15, 2001; 1 page.

* cited by examiner

*Primary Examiner*—Thuan N Du
(74) *Attorney, Agent, or Firm*—Meyertons Hood Kivlin Kowert & Goetzel, P.C.; Jeffrey C Hood; Mark S. Williams

(57) ABSTRACT

System and method for synchronizing multiple devices coupled to a system timing module (STM) via respective first transmission media, wherein two or more of the respective first transmission media have different respective transmission times. The STM and devices share a common clock, in phase and with respect to a common reference. Each device is configured to transmit respective signals to the STM within a common clock cycle. Respective delays corresponding to the devices are determined based on the respective transmission times, where the respective delays are applicable to respective signals received from the devices to synchronize received corresponding pulses in the signals to within a common clock cycle. The respective delays are applied to respective signals received from the plurality of devices to synchronize received corresponding pulses in the signals to within the common clock cycle, after which the STM is operable to trigger the devices as a single device.

24 Claims, 9 Drawing Sheets

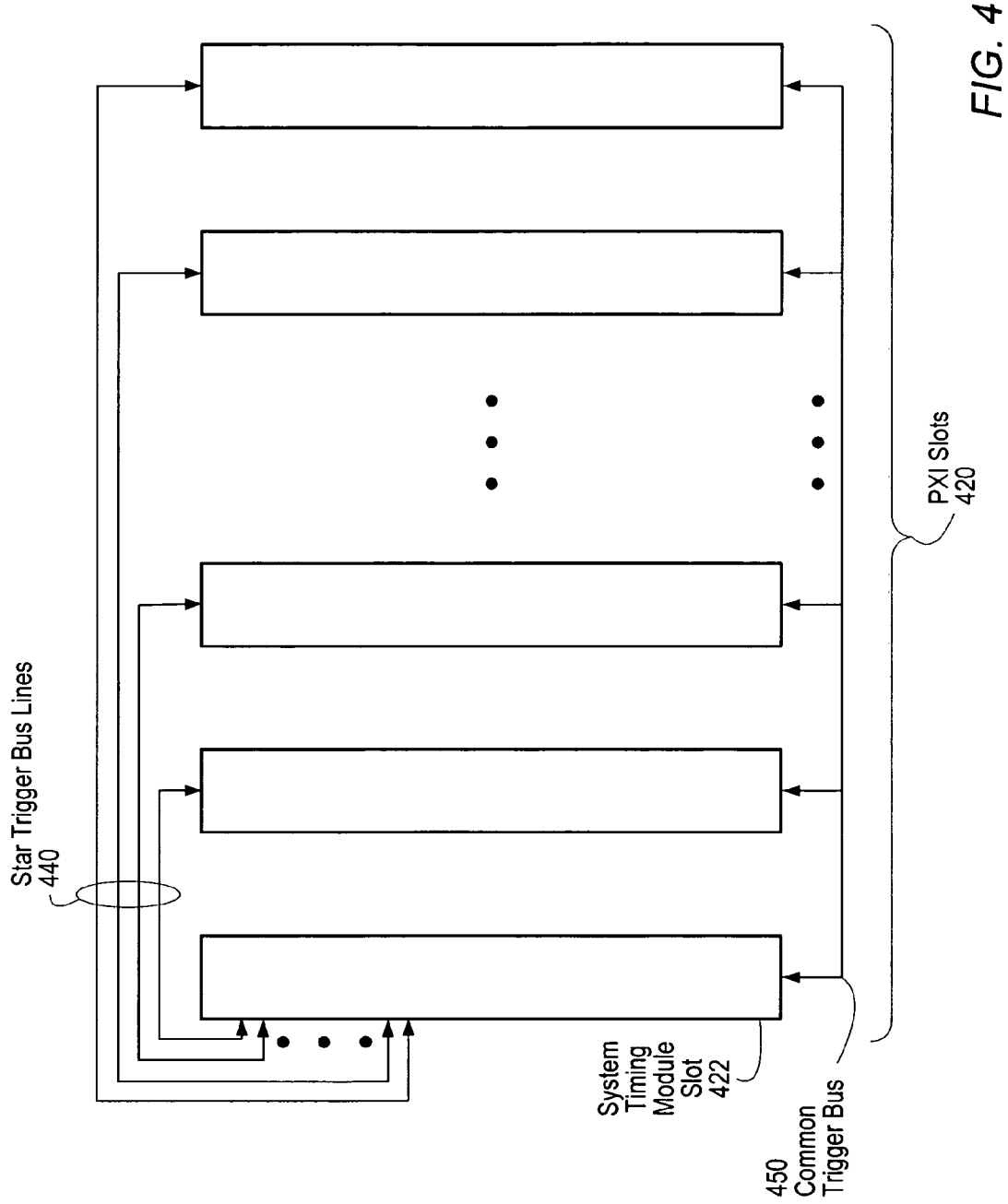

COORDINATING DATA SYNCHRONOUS TRIGGERS ON MULTIPLE DEVICES

FIELD OF THE INVENTION

The present invention relates to the field of device triggering, and more particularly to a system and method for synchronizing triggering across multiple devices.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, frequency of oscillation, humidity, or temperature, among others.

Computer-based instrumentation systems typically include transducers for transducing a physical phenomenon into an electrical signal, signal conditioning logic to perform amplification, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, a serial port or bus, or parallel port of the computer system. The instrumentation hardware may include a DAQ (Data AcQuisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward.

Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

Some computerized instrumentation systems include several instrumentation and/or DAQ devices. Each device may generate and/or capture data based on a sample clock. For example, the sample clock on an arbitrary waveform generator may drive a DAC (Digital to Analog Converter). Two or more devices may be considered to be digitally synchronized when their data capture and/or data generation circuits line up within a sample clock cycle. Digital synchronization may occur when the sample clocks of each device to be synchronized have substantially the same frequency (e.g., the devices' sample clocks may experience instantaneous frequency differences but, on average, the devices' sample clocks may not drift relative to each other). In addition, for digital synchronization, the devices to be synchronized are preferably able to respond to a trigger within the same sample clock period, and in the case of output devices, to output their data to a connector at substantially the same time. As described herein, two clocks are in phase when they are measured as having substantially the same frequency and substantially zero degrees of phase difference.

If the sample clock frequency for a set of devices is chosen to be an integer multiple of a reference clock signal received by all of the devices in that set, and if the frequency multiplier used within each device has substantially zero degrees of phase delay, then the devices in that set will have sample clocks that are synchronous to each other, subject to the tolerance of the reference signal, their layout, and the sample clock generation circuits used by each device. As such, a rising edge on the reference signal will correspond to a rising edge on each device's sample clock.

Even though choosing the sample clock frequency to be an integer multiple of a common reference signal may result in sample clocks that are in phase from device to device (subject to various component and routing tolerances), it may not necessarily achieve a desired type of synchronization (e.g., digital synchronization). For example, in order to achieve digital synchronization between a set of instrumentation devices, trigger conditions should preferably affect every device in the set on the same sample clock edge. If the frequency of the sample clock is too high to reliably pass a bussed signal from one device to another, the trigger signals may either be sent in a slower clock domain than that of the sample clock, such as the reference clock domain, or on a non-bussed means of sending the trigger signal (such as a point-to-point connection) may be used to send trigger signals.

In systems where the set of devices have sample clock frequencies that are not integer multiples of the sample clock frequency, achieving digital synchronization may be even more difficult. The reference clock signal seen by the devices in the set may have a low enough frequency that trigger signals clocked by the reference clock signal can be reliably passed from device to device. However, rising edges on the reference clock may not correspond to rising edges on the sample clock since the frequency of the sample clock is not an integer multiple of the reference clock. If the rising edges of the two clocks do not correspond (or if the phase relationship of sample clocks to the reference clock cannot be guaranteed), clocking trigger signals with the reference clock signal may ensure that devices of the same sample clock frequency will see a trigger at roughly the same time. However, clocking trigger signals with the reference clock signal may not ensure that two devices will see the trigger assertion in the same sample clock cycle.

To illustrate this point, assume two devices, each includes a simple circuit for trigger transfer from the reference clock domain to the sample clock domain, e.g., a first D flip-flop receives a trigger input (e.g., from a bus connecting several instrumentation devices), where the D flip-flop is clocked by the common reference signal (e.g., a 10 MHz signal). The output of D flip-flop, e.g., cTrig, is input to a second D flip-flop, which is clocked by each device's sample clock. The output of the second D flip-flop is signal mTrig.

Even if the sample clocks of the two devices are in phase the trigger may not be seen in the same sample clock cycle on both devices. The output cTrig of the first flip-flop may change too close to the rising edge of the sample clock, causing a setup violation because the input to the second flip-flop has not been stable for the necessary setup time. This setup violation causes the output mTrig of the second flip-flop to be metastable. When the metastability finally settles, it may do so differently on each device, causing them to see the same transition in the trigger signal in different sample clock cycles.

In some applications, multiple devices may be controlled by a single controller, where the devices can be made to appear as a single device as long as all devices can be triggered by the same signal. However, if each device has a separate trigger condition, it is not currently possible to combine the triggers asserted by the separate trigger conditions to create an integrated system trigger. This problem is compounded when the trigger conditions are temporary, such as a recognizing a digital pattern on a particular piece of data.

SUMMARY OF THE INVENTION

Embodiments of a system and method for synchronizing triggering across multiple devices are presented.

In various embodiments, a system including a system timing module and a plurality of coupled devices may be configured. More specifically, the system timing module and the plurality of devices may be configured to share a common clock, e.g., a common sample clock, in phase and with respect to a common reference. In other words, not only are the devices synchronized with respect to the common clock, their internal circuitry is aligned with a common reference signal, described below. As a result, the plurality of devices may be operable to transmit respective signals to the system timing module within a single cycle of the common clock.

In some embodiments, the system timing module and the plurality of devices may each use a virtual clock, e.g., TCLK, derived from the common clock to coordinate transmission and reception of signals from the devices for calibration purposes, described below. In preferred embodiments, the virtual clock may be a divisor of the common clock, i.e., the common clock rate may be an integral multiple of the virtual clock rate.

Note that since each of the devices couples to the system timing module via a respective transmission medium, and since these respective transmission media may be of differing lengths, transit or transmission times for signals sent from the devices to the system timing module may differ accordingly. These different transit times may result in signals sent substantially simultaneously from the devices arriving at the system timing module at different times, which may be problematic for synchronizing operations of the devices.

Thus, respective delays for each of the plurality of devices may be determined to synchronize corresponding pulses received from the devices by the system timing module to within a common clock cycle. In other words, delays may be determined that, when applied to respective data, e.g., corresponding pulses, received from each of the devices, may operate to correct for the different transmission times, and thus to effectively reconstruct or reestablish the substantial simultaneity of the received data (from all the devices).

For example, in one embodiment, each device (e.g., boards included in the chassis) may send a respective synchronous pulse train to the system timing module at the first clock rate via the respective first transmission medium, e.g., via the star trigger bus, e.g., via point-to-point communications. In some embodiments, the synchronous pulse trains are synchronous with the first clock, e.g., TCLK, signal, where, as indicated above, the common clock, e.g., the common sample clock, is a multiple of TCLK. These synchronous pulse trains may be used to determine the delays for each of the devices, i.e., to calibrate the system.

In some embodiments, for each device, a delay module comprised in or coupled to the system timing module may receive successive pulses in the synchronous pulse train and may delay the signal, passing the delayed signal to a flip-flop, which, as is well known in the art of digital circuit design, may be used to coordinate reception of data with respect to a clock signal. In other words, the flip-flop may synchronize the delayed trigger signal with an external clock signal. For example, the flip-flop may wait to output the delayed signal until the external clock signal is asserted.

In one embodiment, where each device couples to the system timing module via a single point-to-point transmission line, the device may send the synchronous pulse train to the system timing module via a single point-to-point transmission line. However, depending upon the phase relationship between a received pulse and the system timing module's common clock signal, metastability may arise. More specifically, since the clock driving the flip-flop is provided by the system timing module, while the trigger is transmitted from the device, transmission times in the device may cause skewing between the respective clocks, even though the device and the module share the common clock.

By appropriately delaying the pulse train signal with respect to the clock signal, e.g., a rising edge of the clock, the flip-flop may output a stable synchronized trigger signal. As is well known, if the edge of a data pulse is too close to the operative edge of a clock signal, e.g., the rising edge, the flip-flop may enter an indefinite state, which may result in metastable phenomena such as uncontrolled oscillations, settling to random values, etc. Metastability may be avoided by proper synchronization of asynchronous inputs, such as by using the delay module.

Thus, in some embodiments, the system timing module may determine a first delay for each device by adjusting the delay for the respective synchronous pulse train such that the signals does not result in metastability of the flip-flop. For example, the system timing module may adjust the delay to determine regions of instability, and determine an optimal delay to avoid these regions, e.g., to position pulses in the pulse train as far as possible from the operative edge of the driving clock.

In some embodiments, determining the respective delays may further include determining respective second delays for each of the first synchronized pulse trains, where the determined respective second delays are synchronous with the common clock, and are applicable to the first synchronized pulse trains to synchronize received corresponding pulses in the first synchronized pulse trains to within a common clock cycle, e.g., the common sample clock. The determined respective delays thus include the respective first delays and the respective second delays, i.e., the sum of the two delays.

Alternatively, in other embodiments, rather than only sending the trigger signal (or during calibration, a pulse in the synchronous pulse train) via a single point-to-point transmission line, the system may use a plurality of point-to-point transmission lines. For example, in some embodiments, the trigger signal may be sent via the first point-to-point transmission line, and the board's common clock signal (or other suitable signals) may be sent from the respective device via a second point-to-point transmission line. In this approach, the trigger signal may be received by a flip-flop (comprised in the system timing module) driven by the board's common clock signal. Because the transmitted trigger and clock signals have substantially the same timing, well-known procedures (such as, for example, delay lines, PLLs with phase shifted outputs, or intentional routing skews) may be used to ensure that the flip-flop avoids metastability, if necessary.

Subsequently, the trigger signal may be converted to the system timing module's common clock domain. In one embodiment, the system timing module may determine the best timing margin, i.e., phase adjustment, available using a suitable phase of the system timing module's common clock, to avoid metastability in the flip-flop. The system timing module may then resynchronize the trigger signal using the determined timing margin or phase adjustment. The resynchronized trigger signal may then be captured by a flip-flop that is driven by the system timing module's common clock.

For example, the system timing module may use a phase locked loop (PLL), a delay locked loop (DLL), or another suitable agent to sweep the phase of the system timing module's common clock from 0 to 360 degrees, and find points where the flip-flop enters a metastable state, and determine and apply a phase adjustment that is furthest from this metastable point. Finally, once the trigger signal is safely in the common clock domain, i.e., avoiding metastability, suitable delays may be determined (e.g., using synchronous delay lines, shift registers, etc.) to synchronize the respective trigger signal with those of the other boards, as described above.

The determined respective delays may be applied to respective signals received from the devices to synchronize received corresponding pulses to within a common clock cycle.

Following the single lined embodiment described above, applying the determined respective delays may include applying the determined respective first delays to each of the synchronous pulse trains, thereby generating the first synchronized pulse trains, and applying the determined respective second delays to the first synchronized pulse trains to synchronize the received corresponding pulses in the first synchronized pulse trains to within a common clock cycle. Once the appropriate delays have been determined and applied, the sending of the respective synchronous pulse trains may be terminated.

Note that in the cases where a synchronous trigger and clock are used, there is no need for the first delay, as metastability is not an issue. However, as described above, the system timing module may determine and apply appropriate phase-adjustments and delays necessary for converting from the common clock domain to the system timing module's common clock domain.

In some embodiments, the system timing module may determine the difference, e.g., via time stamps, between the rising edge of the first clock, e.g., TCLK, and the initial receipt of the respective corresponding pulses in the pulse trains from the plurality of devices. As will be described in more detail below, this difference may be used to reconstruct the time at which all of the devices asserted their respective triggers to within a common clock cycle. Note that this time interval corresponds to the time of transmission for the transmitted signals. Note further that in this embodiment, the time of transmission is assumed to occur in less than one first clock cycle, e.g., a TCLK cycle.

Thus, the system timing module and the plurality of devices may be calibrated to facilitate synchronized assertions by all the plurality of devices.

After calibration, each of the plurality of devices may acquire respective data. For example, in one embodiment, each of the devices may comprise a respective data acquisition board, e.g., in a PXI chassis. As an example, consider a system with a system timing module board and three data acquisition boards, board0, board1, and board2. Input data to be acquired by the boards may be transmitted on a parallel bus with a greater bit width than that of each board. For example, the input data bus may have a bit width of 48 bits, while each board may have a bit width of 16 bits, although it should be noted that these respective bit widths are meant to be illustrative only, and are not intended to limit the bit widths to any particular values. As used herein, the term "word" refers to data of a specified bit width, and may be used to denote the data presented by the bus each read cycle. Each board may operate to receive a respective portion of the total word, e.g., for each read cycle, the first board may receive the first 16 bits of the data, the second board may receive the second 16 bits of the data, and the third board may receive the last 16 bits of the data.

It may be desired for the system to recognize a specified trigger condition, i.e., bit pattern, on the (parallel) input bus. Thus, each DAQ board may need to recognize a respective subset of this data pattern.

Each of the plurality of devices may compare the acquired respective data to a respective trigger condition, and, if the acquired data match the respective trigger condition, the device may send a trigger indicating a match to the system timing module, e.g., through the first transmission medium, e.g., via the star trigger bus, where each board is shown sending a point-to-point trigger signal to the system timing module board. This comparison and triggering may be performed for each of a succession of data patterns read from the parallel bus.

Upon receiving respective triggers indicating matches from all of the plurality of devices within a third common clock cycle, the system timing module may send a common trigger to all of the plurality of devices, e.g., via a second transmission medium, e.g., the common trigger bus. In other words, upon receiving synchronized assertions on each of the trigger lines from the devices, e.g., a "triple assertion", i.e., when the system includes three devices, the system timing module may respond with a common trigger sent to all the devices. In this manner, the devices may be operated and triggered as a single device, thus facilitating data acquisition at a greater bit width (and thus, bandwidth) than any single device supports.

The common trigger sent by the system timing module may be used for any purposes desired. For example, in one embodiment, all the devices asserting (synchronously) may indicate that a first record has been read successfully, and so the system timing module may send the common trigger to indicate that the devices stop acquiring data (at least temporarily), e.g., to allow the matching data to be retrieved, e.g., by a system controller.

In some embodiments, retrieving the matching data from each board or device may include determining at which time each board acquired its respective matching data. In one embodiment, the system timing module may have recorded a time stamp upon the simultaneous assertion from all of the plurality of devices. In this case, for each of the devices, the system timing module may then subtract from the time stamp, the first and second delays, the previously recorded time of transmission, i.e., the difference between the rising edge of the first clock and that of the respective incoming pulse, and the associated latency for that device, i.e., the length of time between the device's reception of the matching data and its transmission of the trigger to the system timing module indicating the reception.

In another embodiment, the system timing module may have recorded a time stamp upon reception of the triggers from each of the plurality of devices. In this case, the system timing module may then subtract from the time stamp for each of the devices, the previously recorded time of transmission and the latency associated with the device.

The resulting calculated times for each device may then be used to determine the location of the matching data. The matching data may then be sent to an external device, e.g., the system controller, logged, or otherwise processed as desired.

BRIEF DESCRIPTION OF THE DRAWINGS

A better understanding of the present invention can be obtained when the following detailed description of the preferred embodiment is considered in conjunction with the following drawings, in which:

FIG. 4 is a high-level block diagram of a PXI chassis with communication buses, according to one embodiment;

Figure 1:
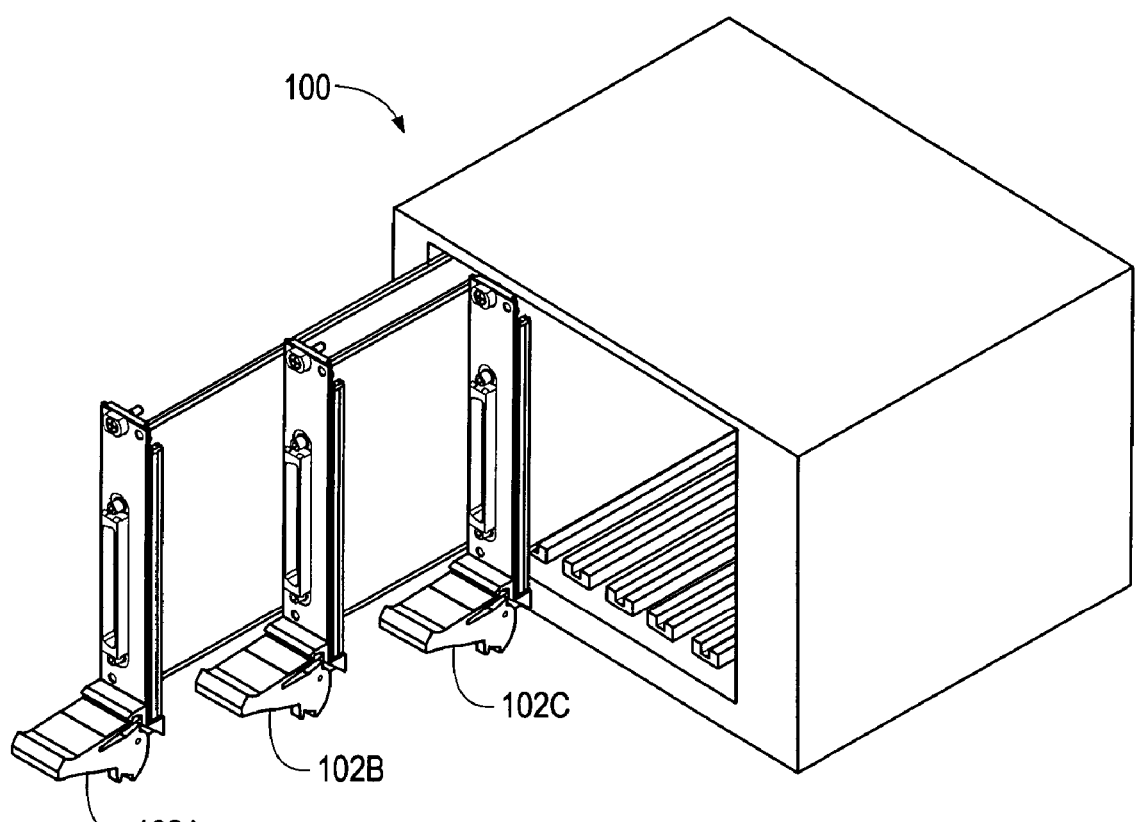
FIGS. 1 and 2 illustrate exemplary systems suitable for implementing various embodiments of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Incorporation by Reference

The following references are hereby incorporated by reference in their entirety as though fully and completely set forth herein:

U.S. patent application Ser. No. 10/260,597, titled "System and Method for Synchronizing Multiple Instrumentation Devices," filed Sep. 30, 2002, whose inventor was Craig M. Conway.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Setup Time—the time delay required between any change in the input to a flip-flop and the next rising clock edge. Setup time may be a problem for asynchronous inputs, such as the individual trigger signals. For example, if the individual trigger signal is asserted too close to the clock edge of the flip-flop, the setup time violation can lead to metastable behavior.

Hold Time—the amount of time that a flip-flop input should remain constant after a rising clock edge. Circuits/systems with asynchronous inputs, such as the individual trigger signals, may exhibit a problem when the hold-time requirement is not met. For example, if an input changes too soon after the clock edge, the hold time violation can lead to metastable behavior for a flip-flop.

Figure 2:
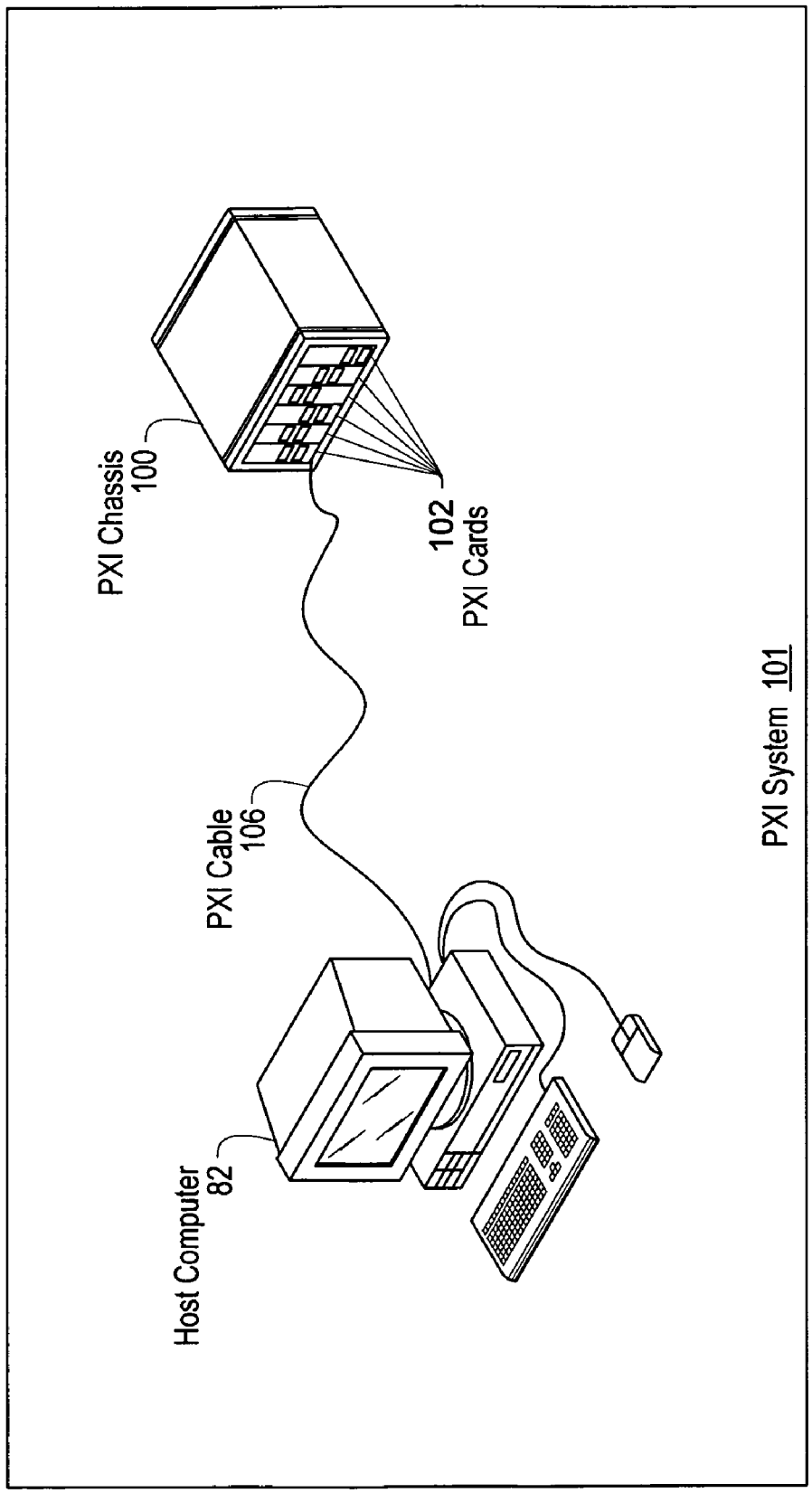

FIGS. 1 and 2—Exemplary Systems

FIGS. 1 and 2 illustrate exemplary systems suitable for implementing various embodiments of the present invention. More specifically, FIG. 1 illustrates a chassis/board-based embodiment that operates as a standalone system, and FIG. 2 illustrates a chassis/board-based embodiment that also includes a computer system, e.g., a desktop computer system or workstation, etc.

As FIG. 1 shows, in this embodiment, a chassis 100, e.g., a PXI (PCI (Peripheral Computer Interface) eXtensions for Instrumentation) chassis, may include a plurality of slots, each operable to receive a respective device, i.e., a board, such as, for example, boards 102A, 102B, and 102C. In preferred embodiments, one of the boards may comprise a system timing module (STM), as will be described below in more detail. The system timing module board may be inserted into a specific slot in the chassis which may be configured specifically for communications with the system timing module board. In preferred embodiments, the system includes a controller, i.e., a computer, which may comprise a controller board installed in the chassis, or a computer system coupled to the chassis, as illustrated in FIG. 2 and described below.

Note that while many of the examples described herein relate to PXI systems, the techniques disclosed are contemplated as broadly applicable to any type of system where multiple devices are to be synchronized.

As is well known in the art, the chassis 100 preferably includes a backplane (not shown) to which inserted boards may electrically couple, e.g., via edge connectors, and whereby the various boards may communicate with one another and/or with external systems or devices. For example, the backplane may include one or more buses facilitating such communications, including, for example, a common trigger bus providing for general board-to-board communications, e.g., triggers, and a point-to-point trigger bus, also referred to as a star trigger bus, providing for point-to-point communications between the system timing module board and each of the other boards in the chassis. The point-to-point lines coupling the boards to the system timing module board may be referred to as Star0 lines.

Turning now to FIG. 2, an exemplary system suitable for implementing various embodiments of the present invention is shown. In this embodiment, chassis 100, e.g., a PXI chassis (including various devices or boards) couples to a computer system 82, over a transmission medium, e.g., PXI cable 106. The computer system 82 may store and execute various software programs that implement at least a portion of the present invention. For example, the computer system 82 may initialize and/or configure the chassis and/or boards, receive, store, and/or analyze data acquired by the boards, and/or otherwise operate in conjunction with the various boards, as will be described below in detail. In some embodiments, the computer system 82 may operate as a controller for the boards in the chassis 100.

It should be noted that while the embodiments described herein are implemented at least in part by boards installed in a chassis, other embodiments are also contemplated. For example, in some embodiments, a plurality of standalone devices may be coupled via a transmission medium, e.g., a network, where one of the devices, e.g., a computer system, such as computer system 82, operates as a controller. As used herein, the term "device" may refer to such a standalone device, or to a board installed in a chassis or computer system.

Figure 3A:
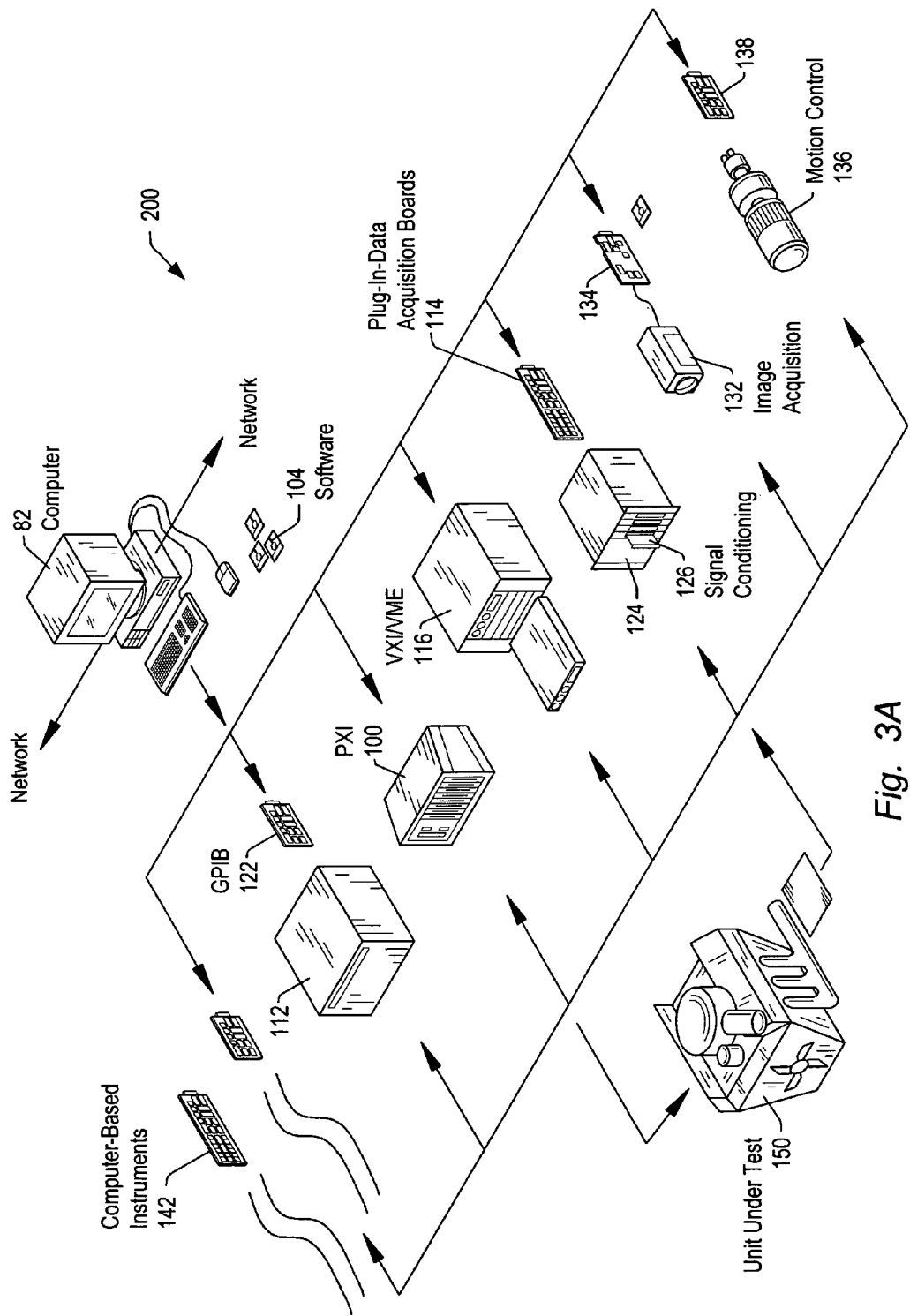
FIG. 3A illustrates an instrumentation control system, according to one embodiment.
Figure 3B:
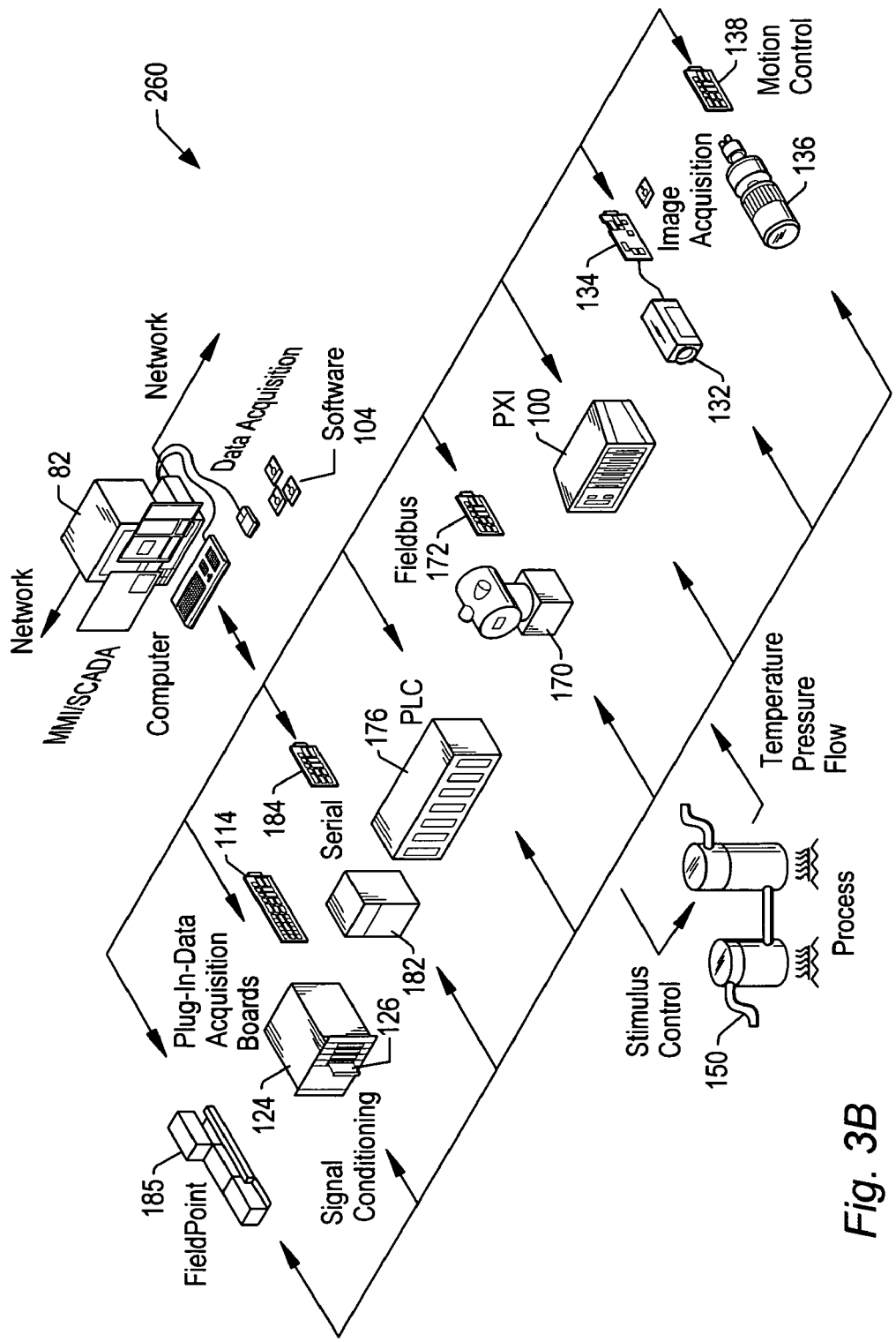
FIG. 3B illustrates an industrial automation system, according to one embodiment.

FIGS. 3A and 3B—Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the invention may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as software applications such as network control, network monitoring, financial applications, games, etc.

FIG. 3A illustrates an exemplary instrumentation control system 200 which may implement embodiments of the invention. The system 200 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument (chassis) 100, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 200 may be used in a data acquisition and control application, in a test and measurement application, an image processing or machine vision application, a process control application, a man-machine interface application, a simulation application, or a hardware-in-the-loop validation application, among others.

FIG. 3B illustrates an exemplary industrial automation system 260 which may implement embodiments of the invention. The industrial automation system 260 is similar to the instrumentation or test and measurement system 200 shown in FIG. 3A. Elements which are similar or identical to elements in FIG. 3A have the same reference numerals for convenience. The system 260 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument (chassis) 100, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Note that in the embodiments of FIGS. 2, 3A, and 3B, described above, one or more of the various devices may couple to each other over a network, such as a local area network (LAN) or a wide area network (WAN), e.g., the Internet.

FIG. 4—PXI Chassis with Communication Buses

FIG. 4 is a high-level block diagram illustrating communication paths or buses in a PXI system, e.g., the PXI chassis of FIGS. 1 and 2. As shown, in this embodiment, the system includes a plurality of slots 420, e.g., PXI slots in a PXI chassis, each operable to receive a respective board, and where one of the slots, e.g., system timing module slot 422, is reserved and configured for a system timing module board. As FIG. 4 also shows, the system includes a common trigger bus 450 facilitating backplane communications among the system timing module board and the plurality of boards, as well as a star trigger bus facilitating point-to-point communications between the system timing module board and the plurality of boards.

As is well known and illustrated in FIG. 4, the common trigger bus 450 facilitates communications between any of the boards installed in the chassis, and optionally between the boards and external devices or systems, e.g., computer system 82. In contrast, the star trigger bus 440, facilitates one-to-one (point-to-point) communications between the system timing module board and each of the other boards in the chassis.

It should be noted that the illustration of the buses shown in FIG. 4 is not intended to show the actual layout of the buses, but rather to illustrate the respective network topologies of the buses. The buses are preferably implemented in the backplane of the chassis, as is well known to those skilled in the art.

Figure 5:
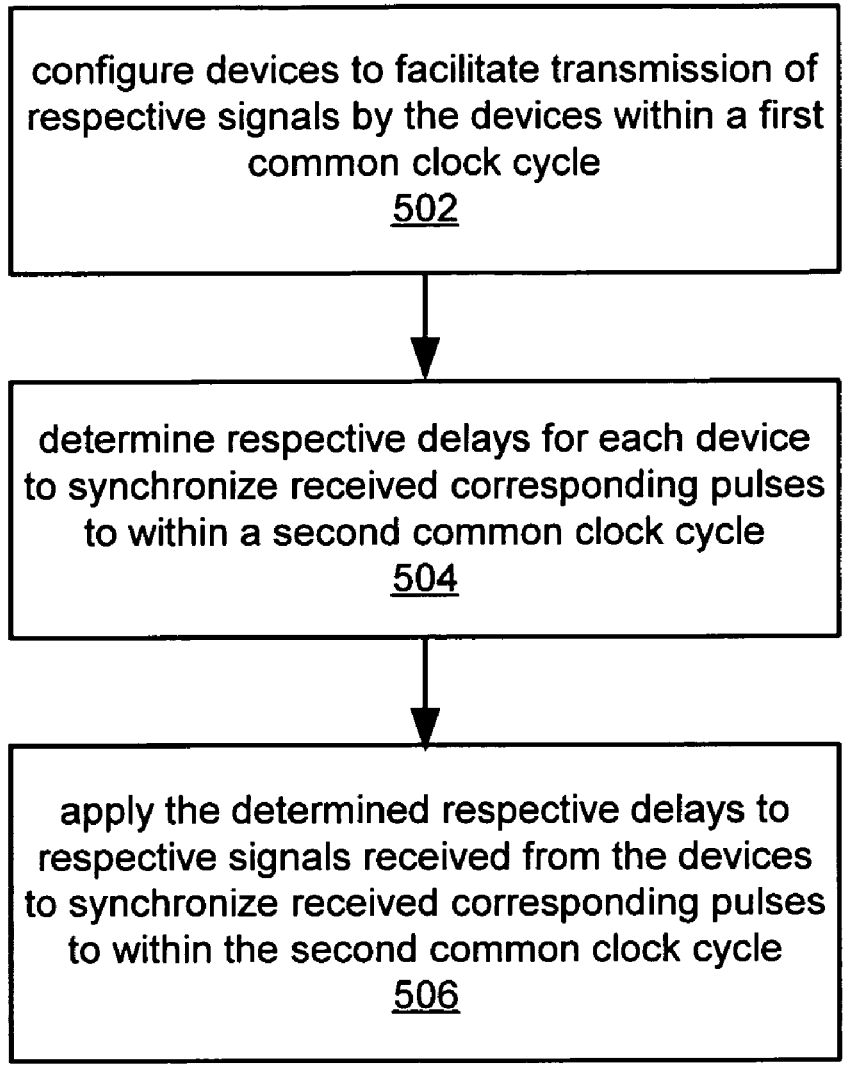
FIG. 5 is a flowchart diagram illustrating one embodiment of a method for calibrating multiple devices.

FIG. 5—Method for Configuring the System

FIG. 5 illustrates a method for configuring the system for synchronized triggering of multiple devices, according to one embodiment. The method shown in FIG. 5 may be used in conjunction with any of the computer systems or devices shown in the above Figures, among other devices. Note that the embodiments described below are directed to a system comprising a system timing module, and a plurality of devices coupled to the system timing module via a first transmission medium, e.g., a star trigger bus, where the plurality of devices are further coupled to one another (n-to-n) via second transmission media, e.g., a common trigger bus. However, other embodiments are also contemplated, e.g., where the system timing module and devices are coupled to one another via a network, e.g., a LAN or WAN (such as the Internet). The devices may each be any type of device as desired, although exemplary devices contemplated include, but are not limited to, data acquisition (DAQ) devices, signal generation devices, signal analysis devices, and automation and control devices, among others.

In various embodiments, some of the method elements shown may be performed concurrently, in a different order than shown, or may be omitted. Additional method elements may also be performed as desired. As shown, this method may operate as follows.

In 502, the system timing module and the plurality of devices may be configured. More specifically, the system timing module and the plurality of devices may be configured to share a common clock, e.g., a common sample clock, in phase and with respect to a common reference. In other words, not only are the devices synchronized with respect to the common clock, their internal circuitry is aligned with a common reference signal, described below. As a result, the plurality of devices may be operable to transmit respective signals to the system timing module within a single cycle of the common clock.

In some embodiments, the system timing module and the plurality of devices may each use a virtual clock, e.g., TCLK, derived from the common clock to coordinate transmission and reception of signals from the devices for calibration purposes, described below. In preferred embodiments, the virtual clock may be a divisor of the common clock, i.e., the common clock rate may be an integral multiple of the virtual clock rate. For example, in one embodiment, the common clock may have a frequency or rate ten times that of the first clock, so that for a first clock have a clock rate of 10 MHz, the common clock may have a 100 MHz rate. Of course, other clock rates and ratios may be used as desired.

For example, a clock signal may be provided to the devices via the backplane, e.g., by the system timing module, a host computer coupled to the system timing module, or an external device coupled to the system, e.g., the chassis, and used by the devices to synchronize their transmissions. Note that the origin of the clock signal is not critical to the operation of the system, as long as it permits synchronous transmission from the devices. Thus, in some embodiments, a primary clock signal may be provided, e.g., by the system timing module or by and external device, and various other clock signals derived from this primary clock signal, such as the common clock described above.

For further information regarding the configuration of 502, please see U.S. patent application Ser. No. 10/260,597 titled "System and Method for Synchronizing Multiple Instrumentation Devices," which was incorporated by reference above.

Note that since each of the devices couples to the system timing module via a respective transmission medium, and since these respective transmission media may be of differing lengths, transit or transmission times for signals sent from the devices to the system timing module may differ accordingly. These different transit times may result in signals sent substantially simultaneously from the devices arriving at the system timing module at different times, which may be problematic for synchronizing operations of the devices.

Thus, in 504, respective delays for each of the plurality of devices may be determined to synchronize corresponding pulses received from the devices by the system timing module to within a common clock cycle. In other words, delays may be determined that, when applied to respective data, e.g., corresponding pulses, received from each of the devices, may operate to correct for the different transmission times, and thus to effectively reconstruct or reestablish the substantial simultaneity of the received data (from all the devices).

For example, in one embodiment, each device (e.g., board) may send a respective synchronous pulse train to the system timing module at the first clock rate via the respective first transmission medium, e.g., via the star trigger bus, e.g., via point-to-point communications. In some embodiments, the synchronous pulse trains are synchronous with the first clock, e.g., TCLK, signal, where, as indicated above, the common clock, e.g., the common sample clock, is a multiple of TCLK. These synchronous pulse trains may be used to determine the delays for each of the devices, i.e., to calibrate the system.

Note that in some embodiments, the particular frequency of the pulse train may not matter, so long as the devices send the respective pulses substantially simultaneously. In other words, the frequency with which the pulses are sent is an implementation detail that may vary without substantially changing the methods described herein. For example, the pulses may be sent in response to a software command, every n TCLK cycles, or via any other mechanism, as long as corresponding pulses are sent by the respective devices in a synchronous manner.

Figure 6:
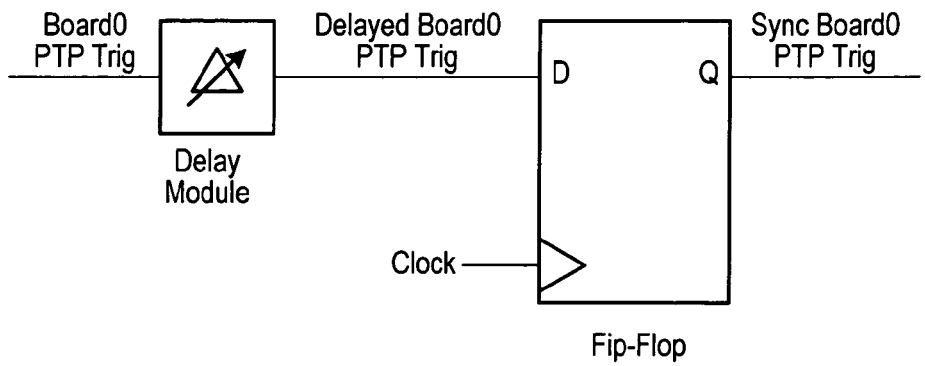
FIG. 6 is a block diagram illustrating insertion of a delay in a signal to avoid metastability in a flip-flip, according to one embodiment.

In some embodiments, for each device, a delay module comprised in or coupled to the system timing module may receive successive pulses in the synchronous pulse train and may delay the signal, passing the delayed signal to a flip-flop, which, as is well known in the art of digital circuit design, may be used to coordinate reception of data with respect to a clock signal, as illustrated in FIG. 6. In other words, the flip-flop may synchronize the delayed trigger signal with an external clock signal. For example, the flip-flop may wait to output the delayed signal until the external clock signal is asserted.

In one embodiment, where each device couples to the system timing module via a single point-to-point transmission line, the device may send the synchronous pulse train to the system timing module via a single point-to-point transmission line. However, depending upon the phase relationship between a received pulse and the system timing module's common clock signal, metastability may arise. More specifically, since the clock driving the flip-flop is provided by the system timing module, while the trigger is transmitted from the device, transmission times in the device may cause skewing between the respective clocks, even though the device and the module share the common clock.

Referring to FIG. 6, a device, e.g., board0, sends a point-to-point (PTP) trigger signal to the adjustable delay module, which, in this case, may comprise an analog delay unit, that applies a delay to the signal and passes the delayed board0 PTP trigger signal to input D of a flip-flop (or functional equivalent). Note that the flip-flop also receives a clock signal, in this case, the common sample clock signal, that drives the output signal (Q) of the flip-flop.

By appropriately delaying the signal with respect to the clock signal, e.g., a rising edge of the clock, the flip-flop may output a stable synchronized board0 PTP trigger signal. As is well known, if the edge of a data pulse is too close to the operative edge of a clock signal, e.g., the rising edge, the flip-flop may enter an indefinite state, which may result in metastable phenomena such as uncontrolled oscillations, settling to random values, etc. Said another way, the correct behavior of a D flip-flop is for the Q output to change to the value of the D input upon a single propagation delay after the clock changes. The flip-flop may exhibit proper behavior if the input, i.e., the trigger signal, meets setup/hold time specifications for the flip-flop. If it does not, then the flip-flop's internal state can enter an undefined state between 0 and 1 for an indefinite period of time, eventually resolving in an unpredictable direction. Metastable behavior can cause a sequential system to go into an illegal state. Metastability may be avoided by proper synchronization of asynchronous inputs, such as by using the delay module.

Thus, in some embodiments, the system timing module may determine a first delay for each device by adjusting the delay for the respective synchronous pulse train such that the signals does not result in metastability of the flip-flop. For example, the system timing module may adjust the delay to determine regions of instability, and determine an optimal delay to avoid these regions, e.g., to position pulses in the pulse train as far as possible from the operative edge of the driving clock.

Figure 7:
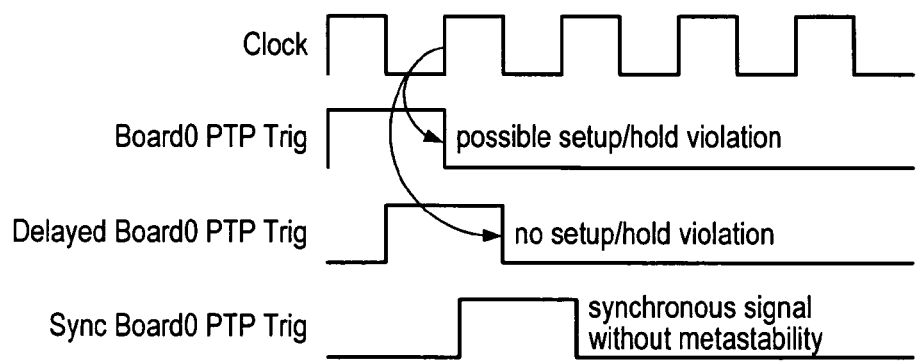
FIG. 7 illustrates exemplary signals with various delays, according to one embodiment.

FIG. 7 illustrates the various signals described above with reference to FIG. 6, specifically, the clock signal driving the flip-flip, the board0 PTP trigger signal, the delayed board0 PTP trigger signal, and the synchronized board0 PTP trigger signal output by the flip-flop, where time increases from left to right. Note that the board0 PTP trigger signal's rising edge is substantially coincident with the rising edge of the clock signal, thus establishing a possible setup/hold violation which may result in metastability. In other words, this signal is neither delayed nor synchronized.

Note further that after an appropriate delay has been applied, the delayed board0 PTP trigger signal pulse safely straddles the rising edge of the clock pulse, thus avoiding any setup/hold violations and corresponding metastability. Note that this signal is not synchronized with the clock signal.

Finally, as FIG. 7 indicates, the synchronized board0 PTP trigger signal, output by the flip-flop, is shown to be in synchrony with the driving clock signal, i.e., the rising edge of the synchronized board0 PTP trigger signal is aligned with the rising edge of the clock signal, e.g., the common sample clock. Note that this signal is both delayed and synchronized. Therefore there is no set-up/hold time violation, and the signal is synchronized with the clock signal.

Thus, in some embodiments, determining the respective delays may include determining respective first delays for each of the synchronous pulse trains, where the determined respective first delays are applicable to respective received pulses in the pulse trains to prevent metastability, to generate first synchronized pulse trains. In other words, for each device, the respective first delay may facilitate clocked reception of signals from the device and avoid metastability in the receiving flip-flop.

In some embodiments, determining the respective delays may further include determining respective second delays for each of the first synchronized pulse trains, where the determined respective second delays are synchronous with the common clock, and are applicable to the first synchronized pulse trains to synchronize received corresponding pulses in the first synchronized pulse trains to within a common clock cycle, e.g., the common sample clock. The determined respective delays thus include the respective first delays and the respective second delays, i.e., the sum of the two delays.

Alternatively, in other embodiments, rather than only sending the trigger signal (or during calibration, a pulse in the synchronous pulse train) via a single point-to-point transmission line, the system may use a plurality of point-to-point transmission lines. For example, in some embodiments, the trigger signal may be sent via the first point-to-point transmission line, and the board's common clock signal (or other suitable signals) may be sent from the respective device via a second point-to-point transmission line. In this approach, the trigger signal may be received by a flip-flop (comprised in the system timing module) driven by the board's common clock signal. Because the transmitted trigger and clock signals have substantially the same timing, well-known procedures (such as, for example, delay lines, PLLs with phase shifted outputs, or intentional routing skews) may be used to ensure that the flip-flop avoids metastability, if necessary.

Subsequently, the trigger signal may be converted to the system timing module's common clock domain. In one embodiment, the system timing module may determine the best timing margin, i.e., phase adjustment, available using a suitable phase of the system timing module's common clock, to avoid metastability in the flip-flop. The system timing module may then resynchronize the trigger signal using the determined timing margin or phase adjustment. The resynchronized trigger signal may then be captured by a flip-flop that is driven by the system timing module's common clock.

For example, the system timing module may use a phase locked loop (PLL), a delay locked loop (DLL), or another suitable agent to sweep the phase of the system timing module's common clock from 0 to 360 degrees, and find points where the flip-flop enters a metastable state, and determine a phase that is furthest from this metastable point, e.g., 180 degrees away from the metastable point. In a more specific example, the system timing module may determine that flip-flop enters a metastable state when the system timing module's common clock is phase-adjusted 30 degrees. The system may subsequently capture the signal at a common clock phase of 210 degrees (i.e., 180 degrees away from the metastability point) so as to avoid metastability in the flip-flop. In some embodiments, the PLL may have several fixed-phase outputs (0, 90, 180, and 270 degrees), and so the system timing module may determine and apply one of those fixed phase outputs that is as far away from the metastability point as possible, i.e., the "safest" fixed phase. In this case, the system timing module may apply a phase adjustment of 180 degrees, i.e., the closest possible phase change available to the determined 210 degree phase adjustment.

Finally, once the trigger signal is safely in the common clock domain, i.e., avoiding metastability, suitable delays may be determined and applied (e.g., using synchronous delay lines, shift registers, etc.) to synchronize the respective trigger signal with those of the other boards, as described above.

In 506, the determined respective delays may be applied to respective signals received from the devices to synchronize received corresponding pulses to within a common clock cycle.

Following the single lined embodiment described above, applying the determined respective delays may include applying the determined respective first delays to each of the synchronous pulse trains, thereby generating the first synchronized pulse trains, and applying the determined respective second delays to the first synchronized pulse trains to synchronize the received corresponding pulses in the first synchronized pulse trains to within a common clock cycle.

In other words, once the first delays have been added, the system timing module may add synchronous delays (the second delays) to the signals until all the corresponding pulses in the respective synchronized pulse trains fall within a single common clock cycle, e.g., all Star0 lines are asserting during the same sample clock cycle on the system timing module. Once the appropriate delays have been determined and added, the sending of the respective synchronous pulse trains may be terminated.

In preferred embodiments, the delays may be applied via respective input buffers, e.g., comprised in the system timing module, or coupled thereto. For example, in some embodiments, input buffering solutions such as Virtex 4, provided by Xilinx may be used to provide adjustable delay functionality to the system timing module. For example, the signals from each device may be received and stored in respective input buffers, and retrieved in accordance with the determined delays to facilitate synchronized (clocked) retrieval of corresponding data from each of the plurality of devices. Note that the sizes of the respective buffers should be specified to accommodate the largest delays predicted for each input stream.

Note that in the cases where a synchronous trigger and clock are used, there is no need for the first delay, as metastability is not an issue. However, as described above, the system timing module may determine and apply appropriate phase-adjustments and delays necessary for converting from the board0 common clock domain to the system timing module's common clock domain.

In some embodiments, the system timing module may determine the difference, e.g., via time stamps, between the rising edge of the first clock, e.g., TCLK, and the initial receipt of the respective corresponding pulses in the pulse trains from the plurality of devices. As will be described in more detail below, this difference may be used to reconstruct the time at which all of the devices asserted their respective triggers to within a common clock cycle. Note that this time interval corresponds to the time of transmission for the transmitted signals. Note further that the in this embodiment, the time of transmission is assumed to occur in less than one first clock cycle, e.g., a TCLK cycle.

Thus, the system timing module and the plurality of devices may be calibrated to facilitate synchronized assertions by all the plurality of devices.

Figure 8:
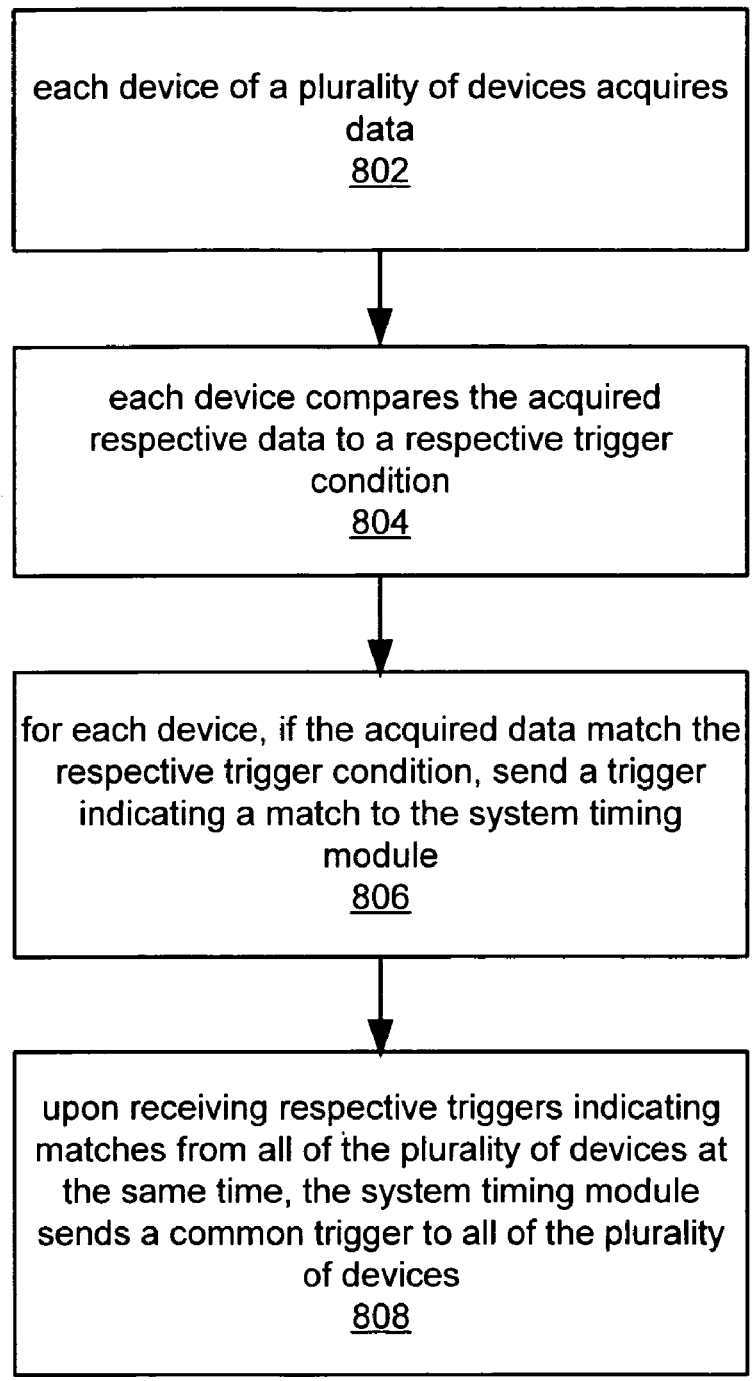
FIG. 8 is a flowchart diagram illustrating one embodiment of a method for synchronizing multiple devices.

FIG. 8—Method for Synchronized Triggering of Multiple Devices

FIG. 8 is a flowchart diagram of a method for synchronizing triggering of multiple devices, according to one embodiment. It is assumed that the calibration procedure described above with reference to FIG. 5, or equivalent, has been completed prior to performing this method. As with the method of FIG. 5, the embodiments described below are directed to a system comprising a system timing module and a plurality of devices coupled to the system timing module via a first transmission medium, e.g., a star trigger bus, where the plurality of devices are further coupled to one another (n-to-n) via second transmission media, e.g., a common trigger bus, although, as noted above, other embodiments are also contemplated.

As noted above, in various embodiments, some of the method elements shown may be performed concurrently, in a different order than shown, or may be omitted. Additional method elements may also be performed as desired. As shown, this method may operate as follows.

Figure 9:
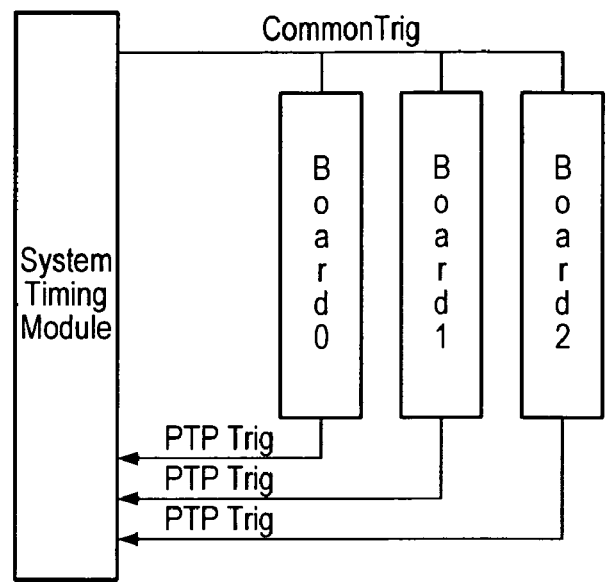
FIGS. 9 and 10 illustrate synchronized triggering, according to one embodiment.

In 802, each of the plurality of devices may acquire respective data. For example, in one embodiment, each of the devices may comprise a respective data acquisition board, e.g., in a PXI chassis. As an example, consider a system with a system timing module board and three data acquisition boards, board0, board1, and board2, as illustrated in FIG. 9. Input data to be acquired by the boards may be transmitted on a parallel bus with a greater bit width than that of each board. For example, the input data bus may have a bit width of 48 bits, while each board may have a bit width of 16 bits, although it should be noted that these respective bit widths are meant to be illustrative only, and are not intended to limit the bit widths to any particular values. As used herein, the term "word" refers to data of a specified bit width, and may be used to denote the data presented by the bus each read cycle. Each board may operate to receive a respective portion of the total word, e.g., for each read cycle, the first board may receive the first 16 bits of the data, the second board may receive the second 16 bits of the data, and the third board may receive the last 16 bits of the data.

It may be desired for the system to recognize a specified data pattern, i.e., bit pattern, on the (parallel) input bus. Thus, each DAQ board may need to recognize a respective subset of this data pattern. For example, FIG. 10 illustrates a case where the desired data pattern is "ABC", where, following the above example, each letter is a 16-bit pattern in the 48-bit word.

In 804, each of the plurality of devices may compare the acquired respective data to a respective trigger condition. For example, in the case of FIG. 10, the first board may determine if its respective data is an "A", the second board may determine if its respective data is a "B", and the third board may determine if its respective data is a "C".

In 806, for each of the plurality of devices, if the acquired data match the respective trigger condition, the device may send a trigger indicating a match to the system timing module, e.g., through the first transmission medium, e.g., via the star trigger bus, as illustrated in FIG. 9, where each board is shown sending a point-to-point trigger signal to the system timing module board.

Figure 10:
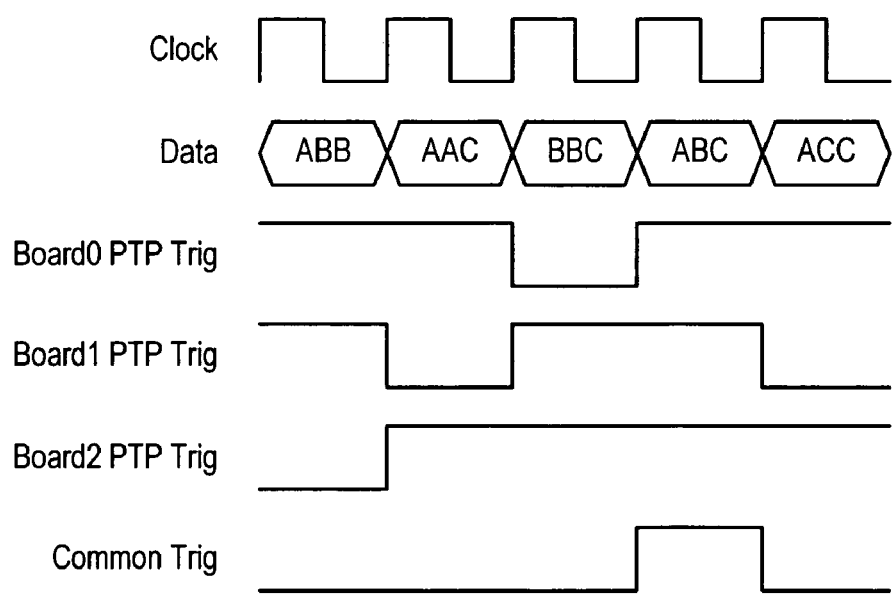

This comparison and triggering may be performed for each of a succession of words read from the parallel bus, as illustrated in FIG. 10, where, for example, the sequence of words are: "ABB", "AAC", "BBC", "ABC", and "ACC". As shown, board0 (the first board) asserts every time an "A" occurs in the first 16 bits, i.e., upon the first, second, fourth, and fifth words, and does not assert otherwise. Similarly, board1 (the second board) asserts every time a "B" occurs in the second 16 bits, i.e., upon the first, third, and fourth words. Board2 (the third board) asserts every time a "C" occurs in the third 16 bits, i.e., upon the second, third, fourth, and fifth words.

Note that this is only one implementation of trigger conditions, and in fact, other trigger conditions are envisioned in addition to digital patters, including but not limited to digital edges, analog triggers, data in range, data not matching, etc.

In 808, upon receiving respective triggers indicating matches from all of the plurality of devices within a third common clock cycle, the system timing module may send a common trigger to all of the plurality of devices, e.g., via a second transmission medium, e.g., the common trigger bus (see FIG. 9). In other words, upon receiving synchronized assertions on each of the trigger lines from the devices, e.g., a "triple assertion", the system timing module may respond with a common trigger sent to all the devices. In this manner, the devices may be operated and triggered as a single device, thus facilitating data acquisition at a greater bit width (and thus, bandwidth) than any single device supports.

The common trigger sent by the system timing module may be used for any purposes desired. For example, in one embodiment, all the devices asserting (synchronously) may indicate that a first record has been read successfully, and so the system timing module may send the common trigger to indicate that the devices stop acquiring data (at least temporarily), e.g., to allow the matching data to be retrieved, e.g., by a system controller.

In some embodiments, retrieving the matching data from each board or device may include determining at which time each board acquired its respective matching data. In one embodiment, the system timing module may have recorded a time stamp upon the simultaneous assertion from all of the plurality of devices. In this case, for each of the devices, the system timing module may then subtract from the time stamp, the first and second delays, the previously recorded time of transmission, i.e., the difference between the rising edge of the first clock and that of the respective incoming pulse, and the associated latency for that device, i.e., the length of time between the device's reception of the matching data and its transmission of the trigger to the system timing module indicating the reception.

In another embodiment, the system timing module may have recorded a time stamp upon reception of the triggers from each of the plurality of devices. In this case, the system timing module may then subtract from the time stamp for each of the devices, the previously recorded time of transmission and the latency associated with the device.

The resulting calculated times for each device may then used to determine the location of the matching data. The matching data may then be sent to an external device, e.g., a system controller, logged, or otherwise processed as desired.

Although the embodiments above have been described in considerable detail, numerous variations and modifications will become apparent to those skilled in the art once the above disclosure is filly appreciated. It is intended that the following claims be interpreted to embrace all such variations and modifications.

We claim:

1. A method for synchronizing a plurality devices coupled to a system timing module via respective first transmission media, wherein two or more of the respective first transmission media have different respective transmission times, wherein the system timing module and the plurality of devices share a common clock, in phase and with respect to a common reference, and wherein the plurality of devices are operable to transmit respective signals to the system timing module within a first cycle of the common clock, the method comprising:

determining respective delays corresponding to each of the plurality of devices based on the respective transmission times, wherein the determined respective delays are applicable to respective signals received from the plurality of devices to synchronize received corresponding pulses in the signals to within a second cycle of the common clock; and applying the determined respective delays to respective signals received from the plurality of devices to synchronize received corresponding pulses in the signals to within the second cycle of the common clock, wherein, after said applying the determined respective delays, the system timing module is operable to trigger the plurality of devices as a single device.

2. The method of claim 1, wherein each of the plurality of devices and the system timing module operate in accordance with a first clock derived from the common clock, wherein the first clock has a first clock rate, wherein the common clock rate is an integral multiple of the first clock rate.

3. The method of claim 2, wherein said determining respective delays comprises:

each of the plurality of devices sending a respective synchronous pulse train to the system timing module in accordance with the first clock rate via the respective first transmission medium;

determining respective first delays for each of the synchronous pulse trains, wherein the determined respective first delays are applicable to respective received pulses in the pulse trains to prevent metastability, to generate first synchronized pulse trains; and determining respective second delays for each of the first synchronized pulse trains, wherein the determined respective second delays are synchronous with the common clock, and are applicable to the first synchronized pulse trains to synchronize received corresponding pulses in the first synchronized pulse trains to within a third cycle of the common clock;

wherein the respective delays comprise the respective first delays and the respective second delays.

4. The method of claim 3, further comprising:

applying the determined respective first delays to each of the synchronous pulse trains, thereby generating the first synchronized pulse trains; and applying the determined respective second delays to the first synchronized pulse trains to synchronize the received corresponding pulses in the first synchronized pulse trains to within the third cycle of the common clock; and terminating said sending the respective synchronous pulse trains.

5. The method of claim 4, further comprising:

each of the plurality of devices acquiring respective data;

each of the plurality of devices comparing the acquired respective data to a respective condition;

for each of the plurality of devices, if the acquired data match the respective data pattern, the device sending a trigger indicating a match to the system timing module through the first transmission medium; and upon detection of respective triggers indicating matches from all of the plurality of devices within a third cycle of the common clock, sending a common trigger to all of the plurality of devices via a second transmission medium.

6. The method of claim 5, wherein said determining respective delays further comprises:

for each of the plurality of devices, determining a respective first transmission medium time interval, comprising a time interval between a rising edge of the first clock and a subsequent pulse in the respective synchronous pulse train, the method further comprising:

determining a time of acquisition for the matching data based on the respective time interval for at least one of the devices.

7. The method of claim 6, wherein said determining the time of acquisition is performed by one or more of:

the system timing module; and a host computer system coupled to the system timing module.

8. The method of claim 6, wherein each of the plurality of devices has an associated latency between acquiring matching data and said sending the trigger indicating the match to the system timing module, wherein said determining the time of acquisition comprises:

for the at least one of the plurality of devices:

recording a time stamp for reception of the trigger indicating the match from the device;

determining a total delay interval based on the associated latency and the respective first transmission medium time interval; and subtracting the total delay interval from the time stamp to determine the time of acquisition for the matching data.

9. The method of claim 6, wherein each of the plurality of devices has an associated latency between acquiring matching data and said sending the trigger indicating the match to the system timing module, wherein said determining the time of acquisition comprises:

for the least one of the plurality of devices:
recording a time stamp for reception of the trigger indicating the match from the device;
determining a total delay interval based on the associated latency, the respective first transmission medium time interval, and the respective first and second delays associated with the device; and
subtracting the total delay interval from the time stamp to determine the time of acquisition for the matching data.

10. The method of claim 6, wherein each of the plurality of devices comprises a buffer for storing the acquired data, wherein the buffer is large enough to store data acquired during a time interval comprising: the associated latency of the respective device, the first transmission medium time interval, the respective first and second delays, a latency of the system timing module comprising a time interval between the detection of the respective triggers and said sending the common trigger, a time interval of transmission of the common trigger, and a response time of the device to the common trigger, the method further comprising:

the system timing module sending the time of acquisition to each of the plurality of devices; and
each of the plurality of devices performing an operation on the matching data specified by the time of acquisition.

11. The method of claim 10, wherein the operation comprises one or more of:

retrieving data from the buffer comprising the matching data, and sending the data to the system timing module;
retrieving data from the buffer comprising the matching data, and sending the data to an external device; and
storing the matching data in memory of the device.

12. The method of claim 4, wherein the system timing module comprises a respective flip-flop and a respective delay module corresponding to each of the plurality of devices, wherein said determining first delays comprises the delay module adjusting the first delay to avoid metastability in the flip-flop, and wherein said applying the first and second delays is performed by the delay module.

13. The method of claim 2, wherein the first clock comprises a virtual clock which provides periodic common clock pulses in accordance with the integral multiple of the common clock rate.

14. The method of claim 1, wherein the system timing module is coupled to a controller, wherein said determining respective delays corresponding to each of the plurality of devices is performed at least in part by the controller, wherein the controller comprises a host computer system coupled to the system timing module or a controller board coupled to the system timing module.

15. The method of claim 1,
wherein the plurality of devices comprise a respective plurality of boards comprised in a chassis.

16. The method of claim 15,
wherein the system timing module comprises a system timing module board comprised in the chassis.

17. The method of claim 16, wherein the first transmission media comprise a star trigger bus facilitating point-to-point communications between the system timing module board and the plurality of boards.

18. The method of claim 16, wherein the second transmission medium comprises a common trigger bus facilitating backplane communications among the system timing module board and the plurality of boards.

19. The method of claim 16, wherein the plurality of boards and the system timing module board each comprises a respective PXI board, and wherein the chassis comprises a PXI chassis.

20. The method of claim 1, further comprising:
each of the plurality of devices acquiring respective data;
each of the plurality of devices comparing the acquired respective data to respective data patterns;
for each of the plurality of devices, if the acquired data match the respective data pattern, the device sending a trigger indicate a match to the system timing module through the first transmission medium; and
upon detection of respective triggers indicating matches from all of the plurality of devices within a third cycle of the common clock, sending a common trigger to all of the plurality of devices via a second transmission medium.

21. The method of claim 1, wherein said determining respective delays comprises:
each of the plurality of devices sending a respective synchronous pulse train to the system timing module in accordance with the common clock rate via a first line of the respective first transmission medium, and concurrently sending the common clock signal from the device via a second line of the respective first transmission medium; and
using the sent common clock signal and the sent synchronous pulse train to determine the delays.

22. The method of claim 21, wherein the system timing module comprises a plurality of flip-flops for each of the plurality of devices, and wherein said using the sent common clock signal and the sent synchronous pulse train to determine the delays comprises:

for each device of the plurality of devices:
a first flip-flop receiving the synchronous pulse train from the device, wherein the first flip-flop is driven by the common clock signal from the device and outputting a first resulting synchronous pulse train;
a second flip-flop receiving the first resulting synchronous pulse train, wherein the second flip-flop is driven by the common clock signal from the system timing module;
determining a phase adjustment for the common clock signal from the system timing module that avoids metastability in the second flip-flop;
adjusting a phase of the common clock signal from the system timing module driving the second flip-flop;
the second flip-flop outputting a second resulting synchronous pulse train;
determining a delay for the second resulting synchronous pulse train;
wherein the respective delays for each of the second resulting synchronous pulse train are applicable to synchronize corresponding pulses in the synchronous pulse trains from the plurality of devices to within the second cycle of the common clock.

23. A system, comprising:
a system timing module; and
a plurality of devices, wherein each device of the plurality of devices is coupled to the system timing module via respective first transmission media, and wherein two or more of the respective first transmission media have different respective transmission times, and wherein the system timing module and the plurality of devices share a common clock, in phase and with respect to a common reference, and wherein the plurality of devices are operable to transmit respective signals to the system timing module within a first cycle of the common clock;
wherein the system timing module is operable to:
  determine respective delays corresponding to each of the plurality of devices based on the respective transmission times, wherein the determined respective delays are applicable to respective signals received from the plurality of devices to synchronize received corresponding pulses in the signals to within a second cycle of the common clock; and
  apply the determined respective delays to respective signals received from the plurality of devices to synchronize received corresponding pulses in the signals to within the second cycle of the common clock, wherein, after the determined respective delays are applied, the system timing module is operable to trigger the plurality of devices as a single device.

24. A system for synchronizing a plurality devices coupled to a system timing module via respective first transmission media, wherein two or more of the respective first transmission media have different respective transmission times, wherein the system timing module and the plurality of devices share a common clock, in phase and with respect to a common reference, and wherein the plurality of devices are operable to transmit respective signals to the system timing module within a first cycle of the common clock, the system comprising:
  means for determining respective delays corresponding to each of the plurality of devices based on the respective transmission times, wherein the determined respective delays are applicable to respective signals received from the plurality of devices to synchronize received corresponding pulses in the signals to within a second cycle of the common clock; and
  means for applying the determined respective delays to respective signals received from the plurality of devices to synchronize received corresponding pulses in the signals to within the second cycle of the common clock, wherein, after said applying the determined respective delays, the system timing module is operable to trigger the plurality of devices as a single device.

* * * * *